(12) United States Patent
Evans

(10) Patent No.: US 6,854,275 B2
(45) Date of Patent: Feb. 15, 2005

(54) METHOD FOR COOLING AUTOMATED STORAGE LIBRARY MEDIA USING THERMOELECTRIC COOLER

(75) Inventor: Jeremy Thomas Evans, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/215,064

(22) Filed: Aug. 8, 2002

(65) Prior Publication Data

US 2004/0025515 A1 Feb. 12, 2004

(51) Int. Cl.⁷ ............................................... F25B 21/02
(52) U.S. Cl. ........................... 62/3.2; 62/3.6; 62/457.1; 62/457.9
(58) Field of Search ........................... 62/3.6, 382, 3.3, 62/440, 429, 3.7, 457.1, 457.9

(56) References Cited

U.S. PATENT DOCUMENTS

| | | | |
|---|---|---|---|
| 3,733,836 A | * 5/1973 | Corini | 62/3 |
| 4,028,688 A | 6/1977 | Goleman | |
| 4,301,658 A | 11/1981 | Reed | |
| 4,922,721 A | 5/1990 | Robertson et al. | 62/3.61 |
| 5,236,258 A | 8/1993 | Bunch | 312/9.31 |
| 5,315,830 A | 5/1994 | Doke et al. | |
| 5,382,943 A | 1/1995 | Tanaka | 340/539 |
| 5,501,076 A | * 3/1996 | Sharp, III et al. | 62/3.6 |
| 5,522,216 A | * 6/1996 | Park et al. | 62/3.6 |
| 5,544,487 A | 8/1996 | Attey et al. | |
| 5,802,863 A | 9/1998 | Cowans | 62/211 |
| 5,924,289 A | 7/1999 | Bishop, II | 62/3.61 |
| 6,119,768 A | * 9/2000 | Dreier et al. | 165/104.33 |
| 6,266,963 B1 | * 7/2001 | Rudick | 62/6 |
| 6,294,721 B1 | 9/2001 | Oravetz et al. | |
| 6,370,882 B1 | * 4/2002 | Adamski et al. | 62/3.6 |
| 6,412,286 B1 | * 7/2002 | Park et al. | 62/3.6 |
| 2002/0121095 A1 | * 9/2002 | Adamski et al. | 21/2 |

FOREIGN PATENT DOCUMENTS

JP        405144247 A  *  6/1993  .................. 369/292

* cited by examiner

*Primary Examiner*—Melvin Jones
(74) *Attorney, Agent, or Firm*—Scully, Scott, Murphy & Presser; Jean M. Barkley, Esq.

(57) ABSTRACT

An automated storage library including: an enclosure having a cartridge storage area in an interior of the enclosure; a plurality of media cartridges disposed in the cartridge storage area; and a cooling unit operatively connected to the enclosure for cooling at least the cartridge storage area of the enclosure. Preferably, the enclosure has an exterior wall and the cooling unit is at least partially disposed in the exterior wall. More preferably, the cooling unit is a thermoelectric cooler having a hot side disposed on an exterior of the enclosure and a cold side disposed in the interior of the enclosure.

22 Claims, 3 Drawing Sheets

METHOD FOR COOLING AUTOMATED STORAGE LIBRARY MEDIA USING THERMOELECTRIC COOLER

BACKGROUND OF THE INVENTION

1. Field of the Invention

The present invention relates generally to automated storage libraries, and more particularly, to methods and devices for cooling automated storage library media using a thermoelectric cooler.

2. Prior Art

Magnetic tape cartridges, magnetic disks and optical disks are all widely used as peripheral memory storage devices for computer systems. Large computer systems often operate in conjunction with external libraries of several, dozens, or even hundreds of such media elements. Although originally such media elements were selected and loaded manually, automated libraries were developed to expedite the handling of the media. Automated storage library machines have been used to greatly increase the efficiency and ease at which large quantities of data, such as that generated by a computer network, can be stored and accessed by external host systems.

These systems typically include robotics for accessing a desired media element, retrieving it from its storage position and loading it into an appropriate reader. The robotic unit moves within a housing under control of a microprocessor to retrieve and load desired storage cartridges into a media drive unit.

As data storage requirements for computer systems have increased from megabytes to gigabytes to terabytes, the development of automated media libraries has received considerable attention. Some embodiments of magnetic tape libraries comprise a small number of magnetic tape cartridges, 10 to 15 being typical, and one or two tape drives housed in a single enclosure. Cabinet systems have also been developed which hold a much larger number of tapes and drives in which the robotic arms, can translate on all three axes, to remove tapes from storage and place them in tape drives.

Several automated storage libraries are known. IBM Corporation introduced the 3850 Mass Storage Subsystem for retrieval of magnetic tape modules in the 1970s. More recently, several automated storage libraries for magnetic tape cartridges and optical disks have been introduced. Examples of an automated storage and retrieval system, employing an automated tape cartridge library can be found in U.S. Pat. Nos. 4,864,511 and 4,864,438. Examples of optical disk libraries can be found in U.S. Pat. Nos. 4,974,156 and 4,945,428. Also systems for general automated libraries capable of handling either tapes or optical disks are described in U.S. Pat. Nos. 5,121,483 and 5,197,055. The robotic picker mechanisms of these libraries include one or more grippers. Each gripper is capable of handling one data storage medium at a time. IBM Corporation also provides the 9246 Optical Library Unit including a two-gripper picker.

Typically, such media has an archival storage specification of 20±5° C., however, automated libraries have operational storage specifications above 25° C., typically 32° C. The libraries also have a temperature rise inside the cartridge storage area, usually 0 to 5° C. Typically, the environment of the library is controlled by controlling the environment surrounding the library, i.e., the room in which the library resides. Therefore, in order for the library to store media in an archival (e.g., 10 year) environment over its entire operating environment, the temperature of the cartridge storage area must be reduced 0–12° C. depending on the library's ambient environment. This temperature differential is difficult to achieve with current systems since it takes time to change the temperature in an entire room and even longer before that change in temperature is transferred to the cartridge storage area of the library. Furthermore, the costs associated with cooling an entire room are greater than the costs for cooling the media storage area.

SUMMARY OF THE INVENTION

Therefore, it is an object of the present invention to provide a system and method for cooling automated storage library media that overcomes the disadvantages of the prior art.

Accordingly, an automated storage library is provided. The automated storage library comprises: an enclosure having a cartridge storage area in an interior of the enclosure; a plurality of media cartridges disposed in the cartridge storage area; and a cooling unit operatively connected to the enclosure for cooling at least the cartridge storage area of the enclosure.

Preferably, the enclosure has an exterior wall and the cooling unit is at least partially disposed in the exterior wall. The cooling unit is preferably a thermoelectric cooler. The thermoelectric cooler preferably comprises a hot side disposed on an exterior of the enclosure and a cold side disposed in the interior of the enclosure. Preferably, the automated storage library further comprises a cold side fan disposed on the cold side of the thermoelectric cooler for circulating cold air in the interior of the enclosure. First baffles are also preferably provided for directing the circulated cold air to the cartridge storage area. More preferably, second baffles are provided for directing the circulated cold air from the cartridge storage area back to the cold side fan. Still further preferred is a hot side fan disposed on the hot side of the thermoelectric cooler for cooling the hot side.

The automated storage library preferably further comprises: at least one sensor disposed in the interior of the enclosure for measuring a temperature in the interior; and a controller operatively connected to the at least one sensor and cooling unit for controlling the cooling unit based on the measured temperature. The at least one sensor is preferably a thermocouple and is preferably disposed in the cartridge storage area of the interior. Preferably, the automated storage library further comprises: a memory operatively connected to the controller for storing a set point temperature; and an alarm operatively connected to the controller for indicating when the measured temperature falls below the set point temperature. Preferably, the alarm is either an audio alarm and/or a visual alarm.

Preferably, the enclosure has an exterior wall and the enclosure further comprises insulation disposed in the exterior wall for reducing a heat loss through the exterior wall.

Also provided is a method for cooling an enclosure of an automated storage library. The method comprises: providing the enclosure having a cartridge storage area in an interior of the enclosure and a plurality of media cartridges disposed in the cartridge storage area; and directly cooling at least the cartridge storage area of the enclosure with a cooling unit operatively connected to the enclosure. Preferably, the enclosure has an exterior wall and the method further comprises disposing the cooling unit at least partially in the exterior wall.

Preferably, the cooling unit is a thermoelectric cooler and the method further comprises circulating cold air in the interior of the enclosure from a cold side of the thermoelectric cooler. The method preferably further comprises directing the circulated cold air to the cartridge storage area from the cold side of the thermoelectric cooler. The method still further preferably comprises directing the circulated cold air from the cartridge storage area back to the cold side of the thermoelectric cooler. Where the cooling unit is a thermoelectric cooler, the method preferably further comprises cooling a hot side of the thermoelectric cooler.

The method preferably also further comprises: measuring a temperature in the interior; and controlling the cooling unit based on the measured temperature. The method still preferably further comprises: storing a set point temperature in a memory; and indicating when the measured temperature falls below the set point temperature.

Where the enclosure has an exterior wall, the method preferably further comprises insulating the exterior wall to reduce a heat loss through the exterior wall.

BRIEF DESCRIPTION OF THE DRAWINGS

These and other features, aspects, and advantages of the apparatus and methods of the present invention will become better understood with regard to the following description, appended claims, and accompanying drawings where:

DETAILED DESCRIPTION OF THE PREFERRED EMBODIMENT

Figure 1:
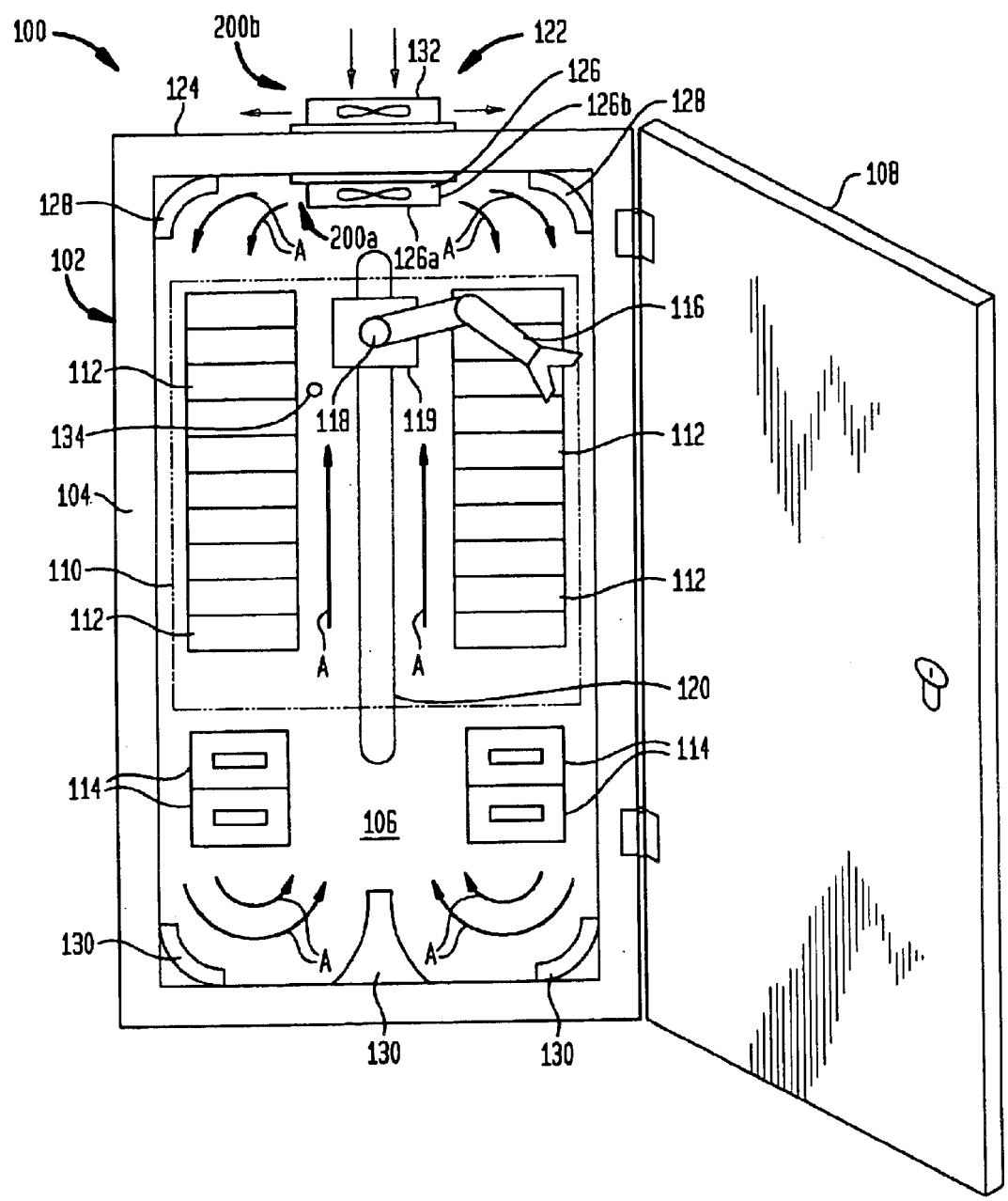
FIG. 1 illustrates a preferred implementation of an automated storage library of the present invention with a front door in the open position.

Referring now to FIG. 1, there is illustrated an automated storage library, generally referred to by reference numeral 100. The automated storage library 100 has an enclosure 102 having a portion 104 defining an interior 106 and at least one open side. The enclosure 102 further has a door 108 for covering and uncovering the open side. Such enclosures are well known in the art. At least a portion of the interior 106 of the enclosure 102 is a cartridge storage area 110 shown with a dotted line. The cartridge storage area 110 can be physically delineated from the remainder of the interior 110 (e.g., by a wall) or delineated only in space.

A plurality of media storage elements 112 are disposed in the cartridge storage area. Each of the media storage elements 112 is preferably a tape cartridge, however other storage medias can also be utilized without departing from the scope or spirit of the present invention, such as magnetic disks and optical disks. As shown in FIG. 1, the plurality of media cartridges 112 are preferably disposed away from a central portion of the interior 106. As will be discussed below, such a configuration is useful to promote a desired circulation of cold air in the interior 106 of enclosure 102, which maximizes the cooling of the media storage area 110 of the enclosure 106. At least one media drive 114, and preferably a plurality of media drives 114 are also provided for reading the media cartridges 112. Media drives 114 can be provided in any type to correspond to the different types of storage media in the media storage area 110. A delivery means for delivering the media cartridges 112 to the appropriate media drive 114 is also provided in the automated storage library 100. The delivery means is preferably a robotic arm 116 having three degrees of freedom, preferably two degrees of freedom by way of a spherical joint 118 and collar 119 and the other degree of freedom by way of a transverse rod 120 wherein the collar 119 is slidingly disposed on the rod 120. Such media cartridges 112, media drives, and robotic arms 116 are well known in the art, as is also their interaction with each other and with a processor connected thereto to perform the desired functions in an automated storage library 100.

One of the ways in which the automated storage library 100 differs from those of the prior art is the provision of a cooling unit 122 operatively connected to the enclosure 102 for cooling at least the cartridge storage area 110 of the enclosure 102. The cooling unit being "operatively connected" to the enclosure 102 means it provides a cooling effect to the interior 106 of the enclosure 102 by means other than by cooling the surrounding environment (e.g., the room in which the enclosure resides). The cooling unit 122 can therefore be integral with the enclosure 102 or at least partially remote therefrom. Preferably, the cooling unit 122 is at least partially disposed in an exterior wall 124 of the enclosure 102. A preferable cooling unit 122 is a thermoelectric cooler such as those manufactured by Ferrotec America Inc.

Figure 4:
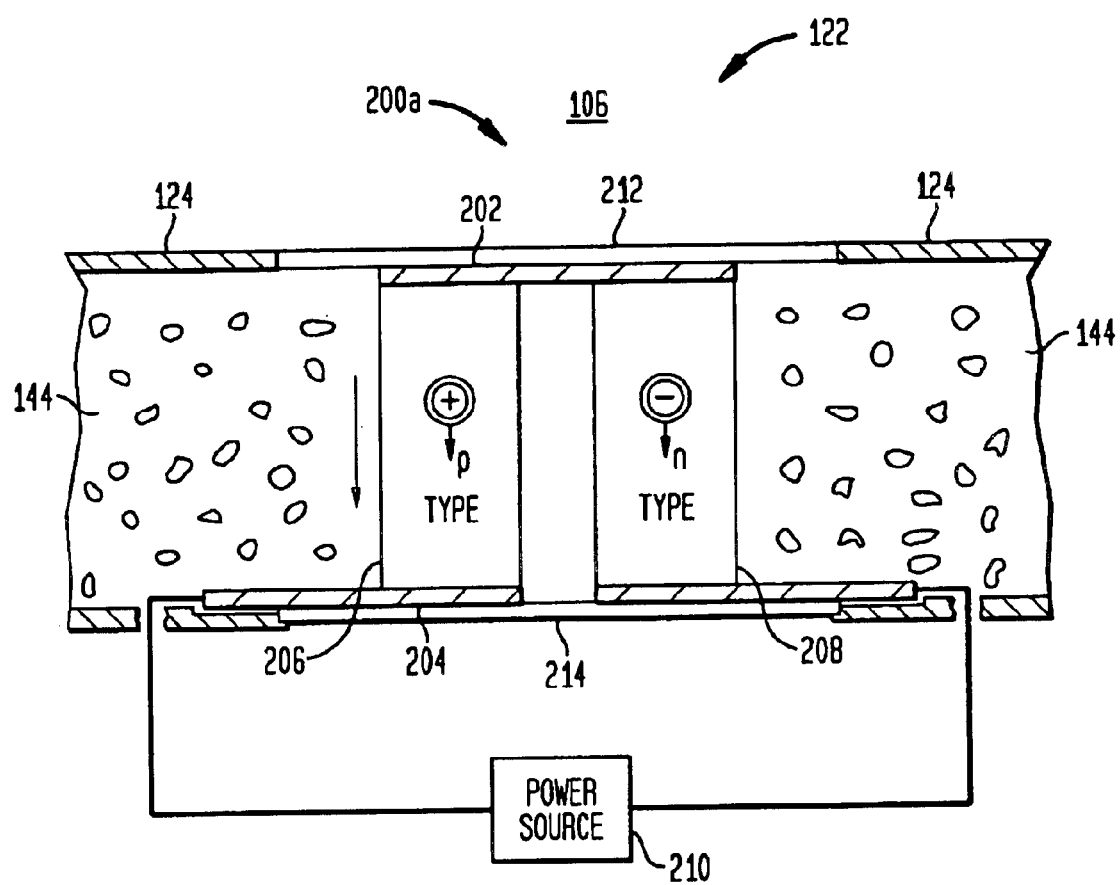
FIG. 4 illustrates a thermoelectric cooler for use in the automated storage library of FIG. 1.

Referring now to FIG. 4, there is illustrated a schematic of a thermoelectric cooler (TEC). A TEC is a small heat pump that has no moving parts. The coolers operate on direct current and may be used for heating or cooling by reversing the direction of current flow. This is achieved by moving heat from a cold side 200a of the module to a hot side 200b with current flow and the laws of thermodynamics. A typical single stage cooler consists of first and second conductors 202, 204 with p and n-type semiconductor material (bismuth telluride) 206, 208 between the first and second conductors 202, 204. The elements of semiconductor material 206, 208 are connected electrically in series and thermally in parallel. When a positive DC voltage is applied to the n-type thermoelement 208 from a DC source 210, electrons pass from the p-type thermoelement 206 to the n-type thermoelement 208 and the cold side 200a temperature will decrease as heat is absorbed. The heat absorption (cooling) is proportional to the current and the number of thermoelectric couples. This heat is transferred to the hot side 200b of the TEC 122, where it is dissipated into a heat sink (not shown) and the surrounding environment. First and second ceramic plates 212, 214 are also used to isolate the respective first and second conductors 202, 204.

The TEC 122 of FIG. 4 is shown for the sake of brevity and by way of example only, those skilled in the art will appreciate that more complex units can be utilized, such as those employing multiple stages and/or multiple thermoelectric couples. The TEC 122 is mounted to the exterior wall 124 using methods known in the art, such as adhesive bonding, compression using thermal grease, or solder. Those skilled in the art will appreciate that a plurality of TECs 122 can be employed to meet the cooling requirements of the automated storage library 100. Those skilled in the art will also appreciate that a TEC 122 is shown by way of example only and not to limit the scope or spirit of the present invention. Other cooling units 122 can be utilized to cool the interior 106 of the enclosure 102, such as a refrigeration unit (not shown) employing a condenser in the interior 106 which is operatively connected to an evaporator and compressor, as is well known in the art. The evaporator and compressor (not shown) may be integral with the enclosure 102 or remote therefrom.

Figure 2:
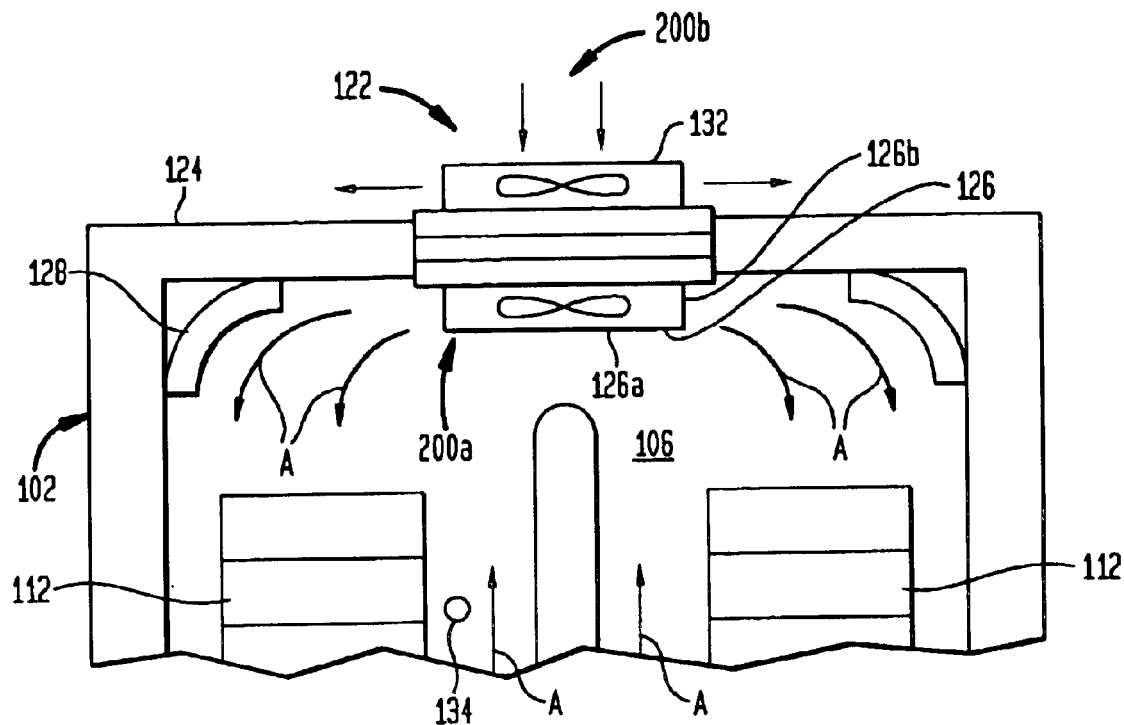
FIG. 2 illustrates a partial sectional view of the automated storage library of FIG. 1.

Referring now to FIGS. 1 and 2, the TEC 122 is preferably oriented wherein the hot side 200b is disposed on an exterior of the enclosure 102 and the cold side 200a is disposed in the interior 106 of the enclosure 102. A cold side fan 126 is preferably disposed on the cold side 200a of the TEC 122 for circulating cold air in the interior 106 of the enclosure 102. Although many types of fans may be used, a centrifugal fan is preferred which draws in air on its face 126a and expels the air across the cold side 126 of the TEC 122 and out its sides 126b. The cold air from the cold side 200a of the TEC 122 is preferably circulated or directed to the cartridge storage area 110 when it is at its coldest. Preferably, first baffles 128 are provided for directing the circulated cold air to the cartridge storage area 110. Second baffles 130 are also preferred for directing the circulated cold air from the cartridge storage area 110 back to the face 126a of the cold side fan 126.

In such an arrangement, the air in the interior 106 of the enclosure 106 is drawn through the central portions of the interior 106 and into the face 126a of the cold side fan 126. The air is then forced against the cold side 200a of the TEC 122 and is cooled thereby. The cold side fan 126 then expels the cool air out of the sides 126b and is directed to the cartridge storage area 110 by the first baffles 128. The air passes through the cartridge storage area 110 and is directed through the central portion of the interior 106 and back to the face 126a of the cold side fan by the second baffles 130. Arrows A indicate this preferred circulation of air in the interior 106 of the enclosure 102. The first and second baffles 128, 130 can be fabricated from sheet metal or plastic and attached to the interior walls of the enclosure 102 by methods well known in the art. Alternatively, the first and second baffles 128, 130 can be integrally formed with the interior walls of the enclosure 102. A hot side fan 132 can also be provided on the hot side 200b of the TEC 122 for cooling the hot side. Cooling the hot side 200b of the TEC 122 increases the efficiency of the TEC 122 and therefore the cooling capacity thereof.

Figure 3:
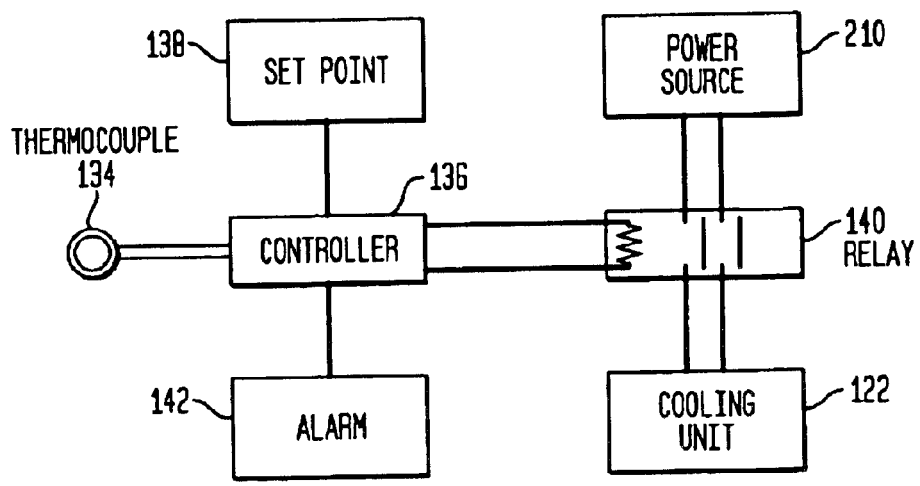
FIG. 3 illustrates a schematic of a control circuit for controlling a cooling unit of the automated storage library.

Referring now to FIG. 3 in combination with FIGS. 1 and 2, there is shown a schematic diagram for the control circuit of the cooling unit (TEC 122) of the automated storage library 100 to maintain a proper environment in the interior 106, particularly, in the cartridge storage area 110 of the interior 106 of the enclosure 102. At least one sensor 134 is disposed in the interior 106 of the enclosure 102 for measuring a temperature in the interior 106. Preferably, the sensor is a thermocouple suitable for the operating environment. The thermocouple 134 can be placed in any position in the interior 106, however, it is preferred that it be placed in the cartridge storage area 110 of the interior 106. Although only one thermocouple 134 is shown and discussed herein, several may be provided. Furthermore, each media cartridge 112 in the cartridge storage area 110 may have a corresponding temperature sensor and may also be integrally formed therewith.

The thermocouple 134 or other sensor is operatively connected to a controller 136 for detecting the measured temperature from the thermocouple 134 and comparing it to a set point temperature stored in memory 138, for example 25° C. If the measured temperature is above the set point temperature, the controller closes an electronic loop, which in turn closes a relay 140 or operates another type of switch to allow the cooling unit 122 to be powered by the power source 210. The relay 140 can be either solid state or electromagnetic and the controller 136 can be dedicated to controlling the interior 106 temperature or have other functions relating to the automated storage library 100, such as controlling the movement of the robotic arm 116. An alarm 142 is also preferably provided for alerting a user or the controller 136 when the interior temperature significantly exceeds the set point temperature or exceeds it for an extended period of time. Although the alarm is preferably an audio alarm, a visual alarm may also be used. Of course, means can be provided for varying the set point temperature, the temperature at which the alarm is activated, and/or the period of time the temperature exceeds the set point temperature before the alarm is activated. Such means may be a keyboard (not shown) or other data entry means operatively connected to the controller 136.

To reduce the heat loss through the exterior wall 124 of the enclosure 102, it is preferred that the exterior wall 124 be insulated with insulation 144. Such insulations are well known in the art, such as urethane foam. Also side panels and doors of the enclosure 102 can be constructed to reduce frame-to-frame airflow.

Those skilled in the art will appreciate that the novel automated storage library of the present invention results in the following advantages over the prior art:

(a) the automated storage library of the present invention does not require additional cooling of the entire data center in which the automated storage library resides;

(b) the automated storage library of the present invention does not require the end user to measure or guess the temperature at which the media cartridges are maintained in order to ensure an archival environment; and (c) the automated storage library of the present invention does not reduce the volume of the interior of the library enclosure.

While there has been shown and described what is considered to be preferred embodiments of the invention, it will, of course, be understood that various modifications and changes in form or detail could readily be made without departing from the spirit of the invention. It is, therefore, intended that the invention be not limited to the exact forms described and illustrated, but should be constructed to cover all modifications that may fall within the scope of the appended claims.

What is claimed is:

1. An automated storage library, comprising:
    an enclosure having a media storage area in an interior of the enclosure;
    a plurality of storage media elements disposed in the media storage area;
    a cooling unit operatively connected to the enclosure for cooling at least the media storage area of the enclosure; and
    delivery means for retrieving at least one of the plurality of media storage elements and delivering the at least one of the plurality of media storage elements to a media drive unit;
    wherein:
    the enclosure has an exterior wall and the cooling unit is at least partially disposed in the exterior wall;
    the cooling unit comprises a thermoelectric cooler; and
    the thermoelectric cooler comprises a hot side disposed on an exterior of the enclosure and a cold side disposed in the interior of the enclosure.

2. The automated storage library of claim 1, further comprising a cold side fan disposed on the cold side of the thermoelectric cooler for circulating cold air in the interior of the enclosure.

3. The automated storage library of claim 2, further comprising first baffles for directing the circulated cold air to the media storage area.

4. The automated storage library of claim 3, further comprising second baffles for directing the circulated cold air from the media storage area back to the cold side fan.

5. The automated storage library of claim 1, further comprising a hot side fan disposed on the hot side of the thermoelectric cooler for cooling the hot side.

6. An automated storage library comprising:
- an enclosure having a media storage area in an interior of the enclosure;
- a plurality of storage media elements disposed in the media storage area;
- a cooling unit operatively connected to the enclosure for cooling at least the media storage area of the enclosure;
- delivery means for retrieving at least one of the plurality of media storage elements and delivering the at least one of the plurality of media storage elements to a media drive unit;
- at least one sensor disposed in the interior of the enclosure for measuring a temperature in the interior; and
- a controller operatively connected to the at least one sensor and cooling unit for controlling the cooling unit based on the measured temperature.

7. The automated storage library of claim 6, wherein the at least one sensor comprises a thermocouple.

8. The automated storage library of claim 6, wherein the at least one sensor is disposed in the media storage area of the interior.

9. The automated storage library of claim 6, further comprising:
- a memory operatively connected to the controller for storing a set point temperature; and
- an alarm operatively connected to the controller for indicating when the measured temperature falls below the set point temperature.

10. The automated storage library of claim 9, wherein the alarm is an audio alarm.

11. The automated storage library of claim 9, wherein the alarm is a visual alarm.

12. A method for cooling an enclosure of an automated storage library, the method comprising:
- providing the enclosure having a media storage area in an interior of the enclosure and a plurality of storage media elements disposed in the media storage area;
- directly cooling at least the media storage area of the enclosure with a cooling unit operatively connected to the enclosure;
- retrieving at least one of the plurality of media storage elements and delivering the at least one of the plurality of media storage elements to a media drive unit:
- measuring a temperature in the interior; and
- controlling the cooling unit based on the measured temperature.

13. The method of claim 12, wherein the enclosure has an exterior wall, the method further comprising disposing the cooling unit at least partially in the exterior wall.

14. The method of claim 12, wherein the cooling unit comprises a thermoelectric cooler, the method further comprising circulating cold air in the interior of the enclosure from a cold side of the thermoelectric cooler.

15. The method of claim 14, further comprising directing the circulated cold air to the media storage area from the cold side of the thermoelectric cooler.

16. The method of claim 15, further comprising directing the circulated cold air from the media storage area back to the cold side of the thermoelectric cooler.

17. The method of claim 12, further comprising:
- storing a set point temperature in a memory; and
- indicating when the measured temperature falls below the set point temperature.

18. A method for cooling an enclosure of an automated storage library, comprising:
- providing the enclosure having a media storage area in an interior of the enclosure and a plurality of storage media elements disposed in the media storage area;
- directly cooling at least the media storage area of the enclosure with a cooling unit operatively connected to the enclosure; and
- retrieving at least one of the plurality of media storage elements and delivering the at least one of the plurality of media storage elements to a media drive unit;
- wherein the cooling unit comprises a thermoelectric cooler, the method further comprising cooling a hot side of the thermoelectric cooler.

19. A method for cooling an enclosure of an automated storage library, comprising:
- providing the enclosure having a media storage area in an interior of the enclosure and a plurality of storage media elements disposed in the media storage area;
- directly cooling at least the media storage area of the enclosure with a cooling unit operatively connected to the enclosure; and
- retrieving at least one of the plurality of media storage elements and delivering the at least one of the plurality of media storage elements to a media drive unit;
- wherein the enclosure has an exterior wall and the method further comprises insulating the exterior wall to reduce a heat loss through the exterior wall.

20. A method for cooling an enclosure of an automated storage library, comprising:
- providing the enclosure having a media storage area in an interior of the enclosure and a plurality of storage media elements disposed in the media storage area;
- directly cooling at least the media storage area of the enclosure with a cooling unit operatively connected to the enclosure; and
- retrieving at least one of the plurality of media storage elements and delivering the at least one of the plurality of media storage elements to a media drive unit;
- wherein at least one of the plurality of storage media elements is a tape cartridge.

21. An automated storage library, comprising:
- an enclosure having a media storage area in an interior of the enclosure;
- a plurality of storage media elements disposed in the media storage area;
- a cooling unit operatively connected to the enclosure for cooling at least the media storage area of the enclosure; and
- delivery means for retrieving at least one of the plurality of media storage elements and delivering the at least one of the plurality of media storage elements to a media drive unit;
- wherein the enclosure has an exterior wall and the enclosure further comprises insulation disposed in the exterior wall for reducing a heat loss through the exterior wall.

22. An automated storage library, comprising:

an enclosure having a media storage area in an interior of the enclosure;

a plurality of storage media elements disposed in the media storage area;

a cooling unit operatively connected to the enclosure for cooling at least the media storage area of the enclosure; and delivery means for retrieving at least one of the plurality of media storage elements and delivering the at least one of the plurality of media storage elements to a media drive unit;

wherein at least one of the plurality of storage media elements is a tape cartridge.

* * * * *